United States Patent [19]

Menegoli et al.

[11] Patent Number: 5,012,130
[45] Date of Patent: Apr. 30, 1991

[54] SMALL AREA AND LOW CURRENT DRAIN FREQUENCY DIVIDER CELL FOR INTEGRATED CIRCUITS

[75] Inventors: Paolo Menegoli, Verona; Marco Morelli, Livorno; Francesco Tricoli, Milano, all of Italy

[73] Assignee: SGS-Thomson Microelectronics srl, Milan, Italy

[21] Appl. No.: 394,226

[22] Filed: Aug. 15, 1989

[30] Foreign Application Priority Data

Aug. 31, 1988 [IT]   Italy ................ 21791 A/88

[51] Int. Cl.$^5$ ............ H03K 3/289; H03K 3/288; H03K 21/02
[52] U.S. Cl. .................. 307/272.2; 307/247.1; 307/291; 377/115
[58] Field of Search .............. 307/272.2, 291, 292, 307/247.1; 377/115

[56] References Cited

U.S. PATENT DOCUMENTS 4,277,698  7/1981  Vasquez ................ 307/272.2
4,357,546  11/1982  Govaert ................ 307/291

FOREIGN PATENT DOCUMENTS 1275738  12/1986  U.S.S.R. ............... 307/272.2

Primary Examiner—John S. Heyman
Attorney, Agent, or Firm—Wolf, Greenfield & Sacks

[57] ABSTRACT

A pair of control transistors and a pair of storage transistors have their collectors coupled to a current source. The emitters of the storage transistors are grounded and the emitters of the control transistors are coupled to the bases of the storage transistors. The control transistor collector and base electrodes are cross-coupled, and the storage transistor collector and base electrodes are also cross-coupled. The emitter of each control transistor is connected to the collector of the associative storage transistor through a respective resistor. Two diodes in series connect the collectors of the control transistor, and a command transistor having a grounded emitter electrode, drives the common node of the diodes.

17 Claims, 1 Drawing Sheet

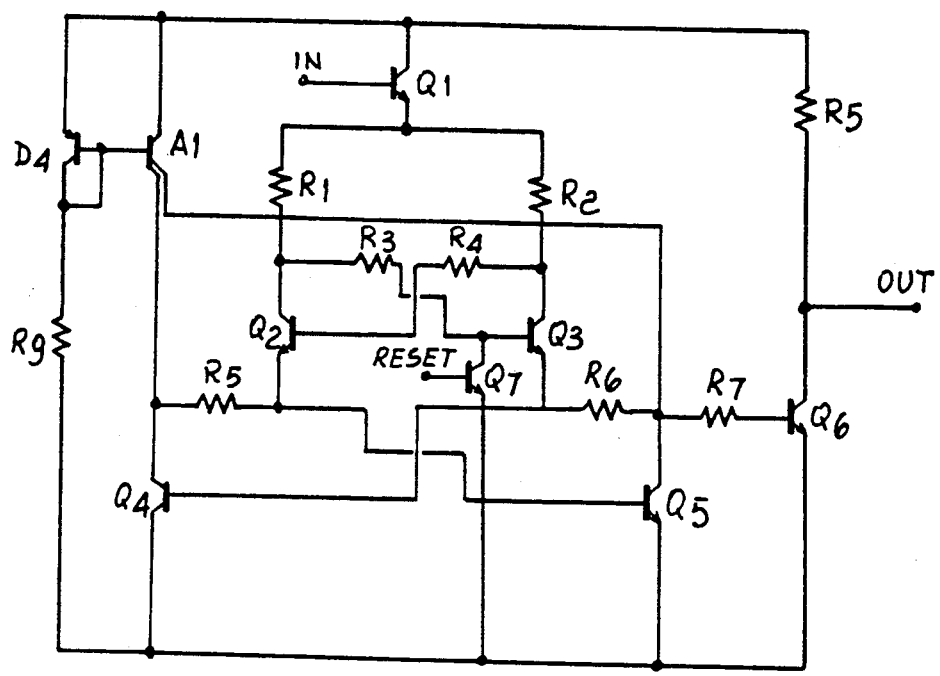
PRIOR ART Fig. 1
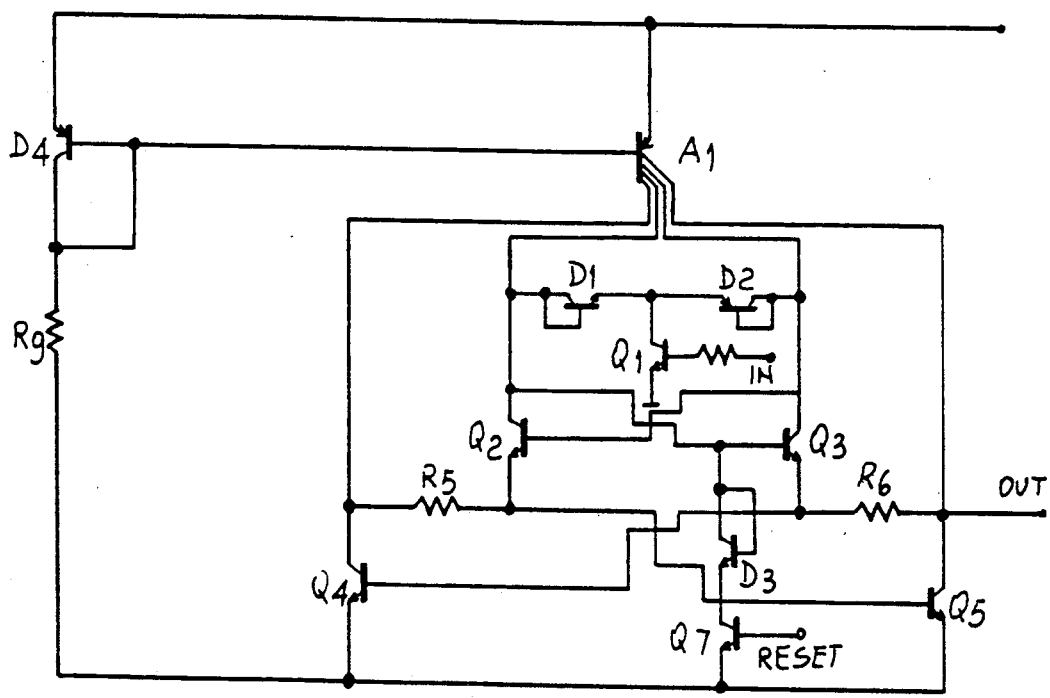
Fig. 2

SMALL AREA AND LOW CURRENT DRAIN FREQUENCY DIVIDER CELL FOR INTEGRATED CIRCUITS

BACKGROUND OF THE INVENTION

The present invention relates to a small area and low current drain frequency divider cell for Integrated Circuits.

As is known, electric low frequency signals are usually generated through the use of very high RC time constants, which are very difficult to be obtained in IC's, in which large capacity and/or resistance values are not feasible. Thus, when a low frequency signal is required in an IC, it is preferred to generate a higher frequency signal and then reduce its frequency by means of a divider comprising a plurality of cascade coupled master-slave flip-flop cells, each of which provides a division by two.

Each of the divider cells typically comprises, in addition to several transistors, also several resistors and, accordingly, each cell will occupy a comparatively large area. Moreover, because of the mentioned difficulty of providing high resistance values, the cell will also absorb a rather high current.

Since a frequency reduction of one order of magnitude requires a divider with three or four flip-flop cells, the above problem is very serious.

SUMMARY OF THE INVENTION

The main object of the invention is to provide a flip-flop frequency divider having a lower area and power drain than known frequency dividers.

According to one aspect of the invention, the above object, as well as other objects and advantages which will become more apparent hereinafter, are achieved by a frequency divider cell for IC's, characterized in that said cell comprises:

a power supply;

a pair of control transistors and a pair of storage transistors, each transistor having a collector, an emitter and a base electrode, all of the collector electrodes being coupled to said power supply, the emitter electrodes of the storage transistors being grounded and the emitter electrodes of the control transistors being coupled to the base electrodes of the storage transistors, the control transistor collector and base electrodes being cross-coupled and the storage transistor collector and base electrodes being also cross-coupled;

respective resistors coupling each the emitter electrode of a control transistor with the collector electrode of a storage transistor;

two diodes coupled back to back in series between the respective collector electrodes of the control transistor;

a command transistor having a grounded emitter electrode, a collector electrode coupled to the common coupling point of the two diodes, and a base electrode operating as an input pin of the frequency divider cell.

BRIEF DESCRIPTION OF THE DRAWINGS

The invention will be disclosed hereinafter in a more detail, with reference to a preferred embodiment, which is shown in the indicative but not limitative accompanying drawings, where:

FIG. 1 is a circuit diagram of a prior art master-slave flip-flop cell;

FIG. 2 is a circuit diagram of a preferred embodiment of a master-slave flip-flop cell according to the invention.

DESCRIPTION OF THE PREFERRED EMBODIMENT

FIG. 1 schematically illustrates a prior art frequency divider cell. Two transistors Q2 and Q3, together with respective load resistors R1, R2 and coupling resistors R3, R4, form a master or driving flip-flop, which is supplied through a transistor Q1, the base electrode of which forms the input IN of the cell. Two transistors Q4 and Q5, together with respective coupling resistors R5, R6, form a slave or storage flip-flop. Circuit elements A1, D4, R9 constitute a power supply that feeds the slave flip-flop. Transistor Q6, controlled by the slave flip-flop through resistor R7, forms a level shifter which delivers its output signal on the pin OUT, with a level adequate for directly driving the pin IN of a subsequent cell.

With reference to the circuit of FIG. 1, when the input signal on the base IN of transistor Q6 is at a low level, Q1 is off and the driving flip-flop comprising the two transistors Q2 and Q3 is disabled. The storage flip-flop Q4, Q5 will have a configuration will depends on the past history, e.g with Q4 on and Q5 off, and hence with a high level output.

As the input signal goes from low to high, the driving or control flip-flop is energized and one of transistors Q2, Q3 is turned on. Since the emitter electrode of Q2 is coupled to the base electrode of Q5, which is off, Q2 will be turned on before Q3 and the cross-coupling will cause Q3 to be held in an off state as long as Q2 is on. If Q2 is on, Q5 must be also on and Q4 off.

During the subsequent switching of the input signal from high to low, the above described situation will be repeated again; that is, the control flip-flop will be deactivated, whereas the storage flip-flop will not change its status. In the following transition, Q3 will be turned on before Q2 (since its emitter electrode is coupled to the base electrode of Q4, which is off), and accordingly it will cause the storage flip-flop to toggle. Thus, the latter will change its status one time for each pair of transitions of the input signal and its output signal will accordingly have a frequency which is a half of the input signal frequency.

FIG. 2 shows a circuit diagram of a master-slave cell according to the invention. This cell still comprises a pair of master transistors Q2, Q3 the emitter electrodes of which are coupled to the base electrodes of a pair of slave transistors Q4, Q5. In this case, however, power supply A1, D4, R9 feeds both pair of transistors. This will limit the current through both legs of the master pair and greatly reduce the cell power drain. Moreover the collector electrode of the transistor Q1, having its emitter electrode coupled to the ground, is coupled to the collector electrodes of Q2 and Q3, through diodes D1 and D2, which provide voltage uncoupling of the two legs of pair of control transistor when, as Q1 is off, and allow the two control transistors to be turned off when Q1 is on.

It should be apparent that the circuit disclosed operates similarly to the prior art, although it has a lower number of components and a lower power drain.

In order to control Q1, a voltage of amplitude to $V_{be}$ is now required (in contrast to the the prior art) and, accordingly, it will not be necessary to provide an output level shifter stage, since the output signal can be taken directly from the collector of Q5. Thus the component elements Q6, R7, R8 of FIG. 1 are dispensed with.

It should also be apparent that the circuit according to the invention also affords the possibility of reducing the number of elements in each cell, thereby reducing the silicon area occupied as well as the current drawn.

While the invention has been disclosed with reference to a preferred embodiment, it should be apparent that numerous modifications and variations may be made all within the scope of the invention as defined in the accompanying claims.

We claim:

1. A frequency divider cell for integrated circuits, characterized in that it comprises:
    a power supply;
    a pair of control transistors and a pair of storage transistors, each transistor having a collector, an emitter and a base electrode, all of the collector electrodes being directly coupled to said power supply, the emitter electrodes of the storage transistors being coupled to a reference potential and the emitter electrodes of the control transistors being coupled to the base electrodes of the storage transistors, the control transistor collector and base electrodes being cross-coupled and the strorage transistor collector and base electrodes being also cross-coupled;
    respective resistors coupling each the emitter electrode of a control transistor with the collector electrode of a storage transistor;
    a first and a second diode coupled back to back in series between the respective collector electrodes of the control transistors;
    a command transistor having an emitter electrode coupled to a reference potential, a collector electrode coupled to the common coupling point of the two diodes, and a base electrode operating as an input pin of the frequency divider cell.

2. A frequency divider cell according to claim 1, characterized in that said first and second diodes each consists of a transistor having an emitter, a collector and a base coupled to said collector, the collectors being respectively coupled to the collector electrode of each of the control transistors.

3. A frequency divider cell according to claim 1, characterized in that said cross-couplings respectively between the control transistors and storage transistors are direct circuit couplings.

4. A frequency divider cell according to claim 1, characterized in that said cell further comprises a reset transistor having an emitter coupled to a reference potential, a base operating as a control pin and a collector, and a third diode coupled between said collector of said reset transistor and the base electrode of one of the control transistors.

5. The frequency divider cell of claim 1, wherein the power supply is a current source.

6. The frequency divider cell of claim 5, wherein the current source is a supply transistor of a polarity opposite the polarity of said control transistors and storage transistors, and having an emitter connected to a voltage source, at least a collector connected to the collectors of said control transistors and storage transistors, and a base controlled by regulating means.

7. The frequency divider cell of claim 6, wherein said supply transistor has four collectors, each being connected to a respective collector of said control transistors and storage transistors.

8. A frequency divider cell for integrated circuits, characterized in that it comprises:
    a power supply;
    a pair of control transistors and a pair of storage transistors, each transistor having a collector, an emitter and a base electrode, all of the collector electrodes being coupled to said power supply, the emitter electrodes of the storage transistors being coupled to a reference potential and the emitter electrodes of the control transistors being coupled to the base electrodes of the storage transistors, the control transistor collector and base electrodes being cross-coupled and the storage transistor collector and base electrodes being also cross-coupled;
    respective resistors coupling each the emitter electrode of a control transistor with the collector electrode of a storage transistor;
    a first and a second diode coupled back to back in series between the respective collector electrodes of the control transistors, said first and second diodes each consisting of a transistor having an emitter, a collector and a base coupled to said collector, the collectors being respectively coupled to the collector electrode of each of the control transistors;
    a command transistor having an emitter electrode coupled to a reference potential, a collector electrode coupled to the emitters forming a common coupling point of the two transistor diodes, and a base electrode operating as an input pin of the frequency divider cell.

9. A frequency divider cell for integrated circuits, characterized in that it comprises:
    a power supply;
    a pair of control transistors and a pair of storage transistors, each transistor having a collector, an emitter and a base electrode, all of the collector electrodes being coupled to said power supply, the emitter electrodes of the storage transistors being coupled to a reference potential and the emitter electrodes of the control transistors being coupled to the base electrodes of the storage transistors, the control transistor collector and base electrodes being cross-coupled and the storage transistor collector and base electrodes being also cross-coupled;
    respective resistors coupling each the emitter electrode of a control transistor with the collector electrode of a storage transistor;
    a first and a second diode coupled back to back in series between the respective collector electrodes of the control transistors;
    a command transistor having an emitter electrode coupled to a reference potential, a collector electrode coupled to the common coupling point of the two diodes, and a base electrode operating as an input pin of the frequency divider cell;
    a reset transistor having an emitter coupled to a reference potential, a base operating as a control pin and a collector, and a third diode coupled between said collector of said reset transistor and the base electrode of one of the control transistors.

10. A frequency divider cell according to claim 1 further comprising an electrical connection means for establishing a dedicated electrically conductive path for each storage and control transistor between the collector electrode of each transistor and the power supply, said paths being separate from other connections to the transistors.

11. A frequency divider cell for integrated circuits, characterized in that it comprises:
 a power supply;
 a pair of control transistors and a pair of storage transistors, each transistor having a collector, an emitter and a base electrode, all of the collector electrodes being coupled to said power supply, the emitter electrodes of the storage transistors being coupled to a reference potential and respective emitter electrodes of the control transistors being coupled to respective base electrodes of one of the storage transistors and also resistively coupled to respective collector electrodes of the other one of the storage transistors, the control transistor collector and base electrodes being cross-coupled, and the storage transistor collector and base electrodes also being cross-coupled;
 a first and a second diode coupled back to back in series between the respective collector electrodes of the control transistors;
 a command transistor having an emitter electrode coupled to a reference potential, a collector electrode coupled to the common coupling point of the two diodes, and a base electrode operating as an input pin of the frequency divider cell; and
 an electrical connection means for establishing a dedicated electrically conductive path for each storage and control transistor between the collector electrode of each transistor and the power supply, said paths being separate from other connections to the transistors.

12. A frequency divider cell according to claim 11, characterized in that said first and second diodes each consists of a transistor having an emitter, a collector and a base coupled to said collector, the emitters being each coupled to the collector electrode of one of the control transistors.

13. A frequency divider cell according to claim 11, characterized in that said cross-couplings respectively between the control transistors and storage transistors are direct circuit couplings.

14. A frequency divider cell according to claim 11, characterized in that said cell further comprises a reset transistor having a grounded emitter, a base operating as a control pin and a collector, and a third diode coupled between said collector of said reset transistor and the base electrode of one of the control resistors.

15. The frequency divider cell of claim 11, wherein the power supply is a current source.

16. The frequency divider cell of claim 15, wherein the current source is a supply transistor of a polarity opposite the polarity of said control transistors and storage transistors, and having an emitter connected to a voltage source, at least a collector connected to the collectors of said control transistors and storage transistors, and a base controlled by regulating means.

17. The frequency divider cell of claim 16, wherein said supply transistor has four collectors, each being connected to a respective collector of said control transistors and storage transistors.

* * * * *